United States Patent
McCollum

(10) Patent No.: US 6,518,824 B1
(45) Date of Patent: Feb. 11, 2003

(54) ANTIFUSE PROGRAMMABLE RESISTOR

(75) Inventor: John McCollum, Saratoga, CA (US)

(73) Assignee: Actel Corporation, Sunnyvale, CA (US)

( * ) Notice: Subject to any disclaimer, the term of this patent is extended or adjusted under 35 U.S.C. 154(b) by 0 days.

(21) Appl. No.: 10/147,197

(22) Filed: May 15, 2002

Related U.S. Application Data

(63) Continuation of application No. 09/737,644, filed on Dec. 14, 2000, now abandoned.

(51) Int. Cl.[7] .............................................. H01H 85/00
(52) U.S. Cl. ....................................... 327/525; 327/526
(58) Field of Search ................................ 327/525, 526, 327/334

(56) References Cited

U.S. PATENT DOCUMENTS

| | | | | |
|---|---|---|---|---|
| 5,276,653 A | * | 1/1994 | McKenny | 327/525 |
| 5,361,001 A | * | 11/1994 | Stolfa | 327/525 |
| 5,414,364 A | * | 5/1995 | McCollum | 324/550 |
| 5,682,049 A | * | 10/1997 | Nguyen | 257/360 |
| 5,736,894 A | * | 4/1998 | Suwa | 327/540 |
| 6,188,092 B1 | * | 2/2001 | Hatano et al. | 257/229 |
| 6,232,823 B1 | * | 5/2001 | Tsuchida | 327/525 |
| 6,255,894 B1 | * | 7/2001 | Cutter et al. | 327/525 |

* cited by examiner

*Primary Examiner*—Terry D. Cunningham
(74) *Attorney, Agent, or Firm*—Sierra Patent Group, Ltd.

(57) ABSTRACT

A user-programmable resistor module includes a resistive element connected in series with first and second antifuses between an input circuit node and an output circuit node. Third and fourth antifuses are connected in series between the input circuit node and the output circuit node. A first programming transistor is connected between the common connection of the resistive element and the first antifuse and a first programming voltage node. A second programming transistor is connected between the common connection of the first and second antifuses and a fixed voltage node such as ground. A third programming transistor is connected between the input circuit node and the first programming voltage node. A fourth programming transistor is connected between the common connection of the third and fourth antifuses and a fixed voltage node such as ground. If the user-programmable resistor module described herein is used alone, a termination programming transistor is connected between the output circuit node and a second programming voltage node.

5 Claims, 2 Drawing Sheets

ANTIFUSE PROGRAMMABLE RESISTOR

CROSS-REFERENCE TO RELATED APPLICATIONS

This application is a continuation of U.S. patent application Ser. No. 09/737,644, filed Dec. 14, 2000, now abandonded.

BACKGROUND OF THE INVENTION

1. Field of the Invention

The present invention relates to user-programmable circuits. More particularly, the present invention relates to a user-programmable resistor.

2. The Prior Art

Programmable resistances of several varieties are known in the integrated circuit art. According to one variety, a laser-trimmable resistance element is disposed on an integrated circuit. After fabrication of the integrated circuit, but prior to packaging the integrated circuit, the resistance value of the laser-trimmable resistance element may be trimmed using a laser to alter the geometry of the resistance element.

This method has proved to be successful, but its use is limited to a production environment equipped with expensive and complex laser-trimming apparatus. In addition, after the resistance value of the laser-trimmable resistance element has been adusted, the integrated circuit containing it must be subjected to further processing in order to complete the packaging operation that seals the integrated circuit from the environment. Trimming of the resistance value of the laser-trimmable resistance element cannot be performed by the end user of the integrated circuit.

It is also known to use the channel resistance of a floating gate transistor as a variable resistance element. Programming the resistance value is achieved by transferring charge on to or off of the floating gate using one of the available charge transport mechanisms built into the integrated circuit.

There continues to exist a need for alternative solutions to providing a resistance element in an integrated circuit whose resistance value can be programmed by an end user of the integrated circuit.

BRIEF DESCRIPTION OF THE INVENTION

According to the present invention, a user-programmable resistor module includes a resistive element connected in series with first and second antifuses between an input circuit node and an output circuit node. Third and fourth antifuses are connected in series between the input circuit node and the output circuit node. A first programming transistor is connected between the common connection of the resistive element and the first antifuse and a first programming voltage node. A second programming transistor is connected between the common connection of the first and second antifuses and a fixed voltage node such as ground. A third programming transistor is connected between the input circuit node and the first programming voltage node. A fourth programming transistor is connected between the common connection of the third and fourth antifuses and a fixed voltage node such as ground.

If the user-programmable resistor module described herein is used alone, a termination programming transistor is connected between the output circuit node and a second programming voltage node. However, according to the present invention, a plurality of the user-programmable resistor modules of the present invention may be connected in series to allow programming a plurality of resistance values.

In an arrangement containing a plurality of series-connected user-programmable resistor modules according to the present invention, the input circuit node of each successive user-programmable resistor modules is connected to the output circuit node of the preceding user-programmable resistor module. The connections described above for the second and fourth programming transistors in all additional series-connected user-programmable resistor modules are the same for all user-programmable resistor modules.

The first programming transistor of each odd numbered user-programmable resistor module is connected between the common connection of its resistive element and its first antifuse and the first programming voltage node as described for the individual user-programmable resistor module described above. The first programming transistor of each even numbered user-programmable resistor module is connected between the common connection of its resistive element and its first antifuse and the second programming voltage node.

The third programming transistor of each odd numbered user-programmable resistor module is connected between its input circuit node and the first programming voltage node. The third programming transistor of each even numbered user-programmable resistor module is connected between its input circuit node and the second programming voltage node.

As is the case where a single user-programmable resistor module is used according to the present invention, a termination programming transistor is connected between the output circuit node of the last user-programmable resistor module in the plurality of series-connected user-programmable resistor modules and a programming voltage node. The second programming voltage node is used where the last user-programmable resistor module is an odd numbered one and the first programming voltage node is used where the last user-programmable resistor module is an even numbered one.

According to the present invention, the resistive element of any user-programmable resistor module is used by programming the first and second antifuses to connect the resistive element between the first and second circuit nodes and leaving the third and fourth antifuses unprogrammed. Similarly, the resistive element of any user-programmable resistor module is unused by programming the third and fourth antifuses to connect the first and second circuit nodes together and by leaving the first and second antifuses unprogrammed.

When a plurality of series-connected user-programmable resistor modules are used in accordance with the present invention, persons of ordinary skill in the art will appreciate that different combinations of resistor values such as an R2R ladder may be used to increase its versatility.

BRIEF DESCRIPTION OF THE DRAWING FIGURES

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

Figure 1:
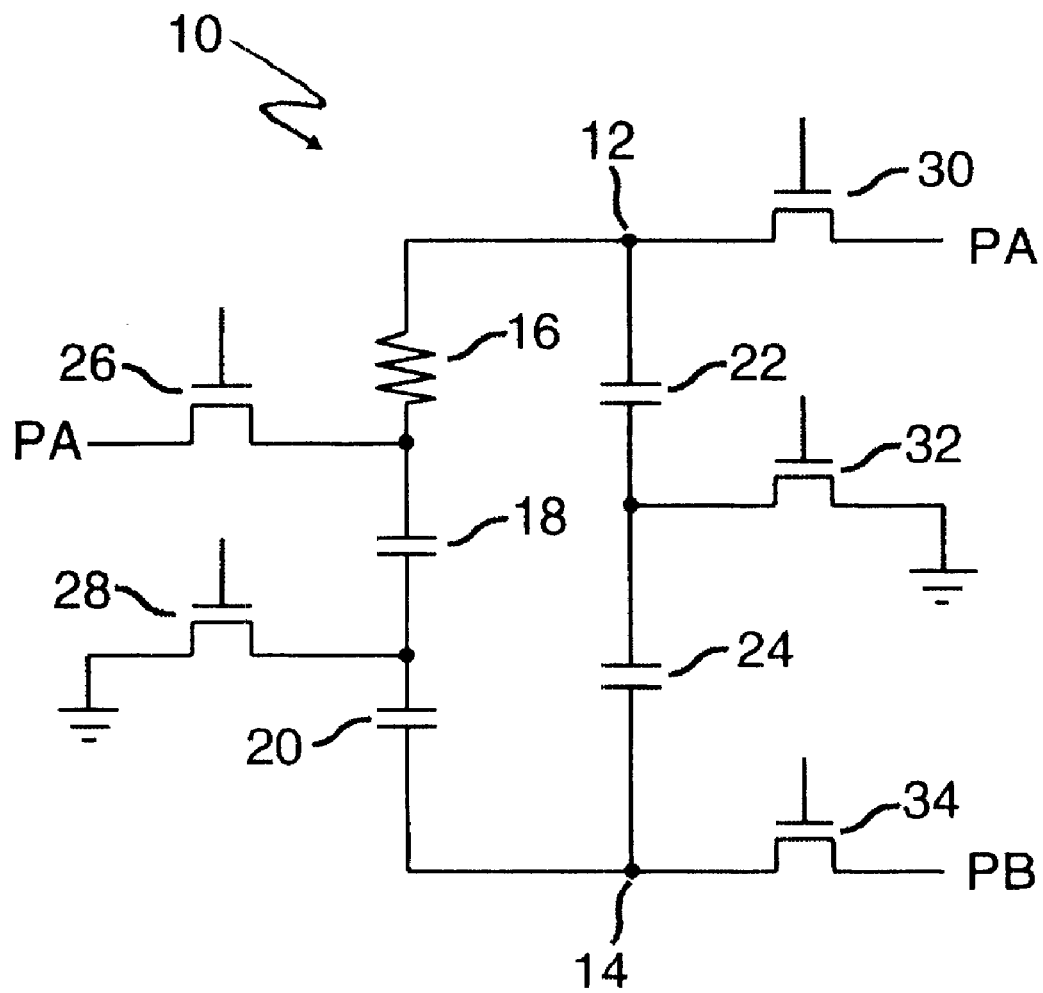
FIG. 1 is a schematic diagram of an illustrative embodiment of a user-programmable resistor module according to the present invention.

Referring first to FIG. 1, a schematic diagram shows an illustrative embodiment of a user-programmable resistor module 10 according to the present invention. User-programmable resistor module 10 includes input node 12 and output node 14. A resistive element 16, which may be formed from, for example, graphite, polysilicon, diffusion, or a metal film such as nichrome, etc., is disposed between input node 12 and output node 14 and is connected in series with first antifuse 18 and second antifuse 20. Third antifuse 22 and fourth antifuse 24 are connected in series between input node 12 and output node 14.

A first programming transistor 26 is connected between the circuit node common to resistive element 16 and first antifuse 18 and a first programming voltage terminal PA. A second programming transistor 28 is connected between the circuit node common to first antifuse 18 and second antifuse 20 and a fixed potential such as ground. A third programming transistor 30 is connected between the input node and the first programming voltage terminal PA. A fourth programming transistor 32 is connected between the circuit node common to third antifuse 22 and fourth antifuse 24 and the fixed potential. Finally, if the user-programmable resistor module 10 is used alone, a terminating programming transistor 34 is connected between the output node 14 and a second programming voltage terminal PB. Persons of ordinary skill in the art will recognize that while the programming transistors are shown in FIG. 1 as N-Channel MOS transistors, transistors of other types may be employed as well in the present invention.

As will be appreciated by persons of ordinary skill in the art, the gates of programming transistors 26, 28, 30, 32, and 34 are driven from a programming control circuit (not shown in FIG. 1). Numerous circuits can be used to control the gates of programming transistors 26, 28, 30, 32 and particular details of any such circuit are trivial to persons of ordinary skill in the art and will be apparent from the description of the details of the programming method disclosed herein.

In use, the user-programmable resistor module 10 may be left unprogrammed. In this case it presents a very high resistance (essentially an open circuit) between input node 12 and output node 14.

If the first antifuse 18 and the second antifuse 20 are programmed, resistive element 16 is connected between input node 12 and output node 14. The two programmed antifuses 18 and 20 will together add about 40 ohms to the resistance value of resistance element 16.

If the third antifuse 22 and the fourth antifuse 24 are programmed, resistive element 16 is shunted and input node 12 is essentially connected to output node 14. The two programmed antifuses 22 and 24 will provide a resiatnce of about 40 ohms between input node 12 and output node 14.

To program the first pair of antifuses 18 and 20, first antifuse 18 is programmed by turning on programming transistors 26 and 28 by activating their gates. Next, antifuse 20 is programmed by turning on programming transistors 26 and 34 by activating their gates. Second programming transistor 28 can be a small device and the soaking portion of an antifuse programming cycle can be performed using larger programming transistors 26 and 34, through which the soaking current is supplied to both antifuses 18 and 20 in series.

To program the second pair of antifuses 22 and 24, either third antifuse 20 or fourth antifuse 22 is programmed by turning on programming transistors 32 and one of programming transistors 30 and 34, depending on whether third antifuse 20 or fourth antifuse 22 is to be programmed first. The selected transistors are turned on by activating their gates. Next, the other one of antifuses 20 and 22 is programmed by turning on programming transistors 30 and 34 by activating their gates. As in the case of second programming transistor 28, fourth programming transistor 32 can be a small device and the soaking portion of an antifuse programming cycle can be performed using larger programming transistors 30 and 34, through which the soaking current is supplied to both antifuses 22 and 24 in series.

From an examination of FIG. 1. persons of ordinary skill in the art will observe that the use of pairs of antifuses prevents the unwanted programming of the antifuses in the parallel leg of the circuit. For example, after antifuse 18 is programmed and programming transistors 26 and 34 are turned on, the programming voltage is placed directly across second antifuse 20 but is in series with resistive element 16 and third and fourth antifuses 22 and 24, thus dividing the programming voltage such that the potential across either one of third and fourth antifuses 22 and 24 is insufficient to overstress or program them. A similar condition exists in the case where it is desired to program antifuses 22 and 24 while leaving antifuses 18 and 20 unprogrammed.

A particularly useful application of the present invention utilizes a plurality of user-programmable resistor modules 10 connected in series such that the output node 14 of the first user-programmable resistor module 10 is connected to the input node 12 of the second user-programmable resistor module 10 and so on. The fixed potential connections described above for the second and fourth programming transistors 28 and 32 in all series-connected user-programmable resistor modules are the same as described above.

In a series-connected arrangement of a plurality of user-programmable resistive elements according to the present invention, the first programming transistor 26 of each odd-numbered user-programmable resistor module 10 is connected between the common connection of its resistive element 16 and its first antifuse 18 and the first programming voltage node PA as disclosed for the individual user-programmable resistor module 10 described above with reference to FIG. 1. The first programming transistor 26 of each even-numbered user-programmable resistor module 10 is connected between the common connection of its resistive element 16 and its first antifuse 18 and the second programming voltage node PB.

The third programming transistor 30 of each odd-numbered user-programmable resistor module 10 is connected between its input circuit node 12 and the first programming voltage node PA. The third programming transistor 30 of each even-numbered user-programmable resistor module 10 is connected between its input circuit node 12 and the second programming voltage node PB.

As is the case where a single user-programmable resistor module 10 is used according to the present invention, a termination programming transistor is connected between the output circuit node of the last user-programmable resistor module in the plurality of series-connected user-programmable resistor modules and a programming voltage node. The second programming voltage node is used where the last user-programmable resistor module is an odd numbered one and the first programming voltage node is used where the last user-programmable resistor module is an even numbered one.

Figure 2:
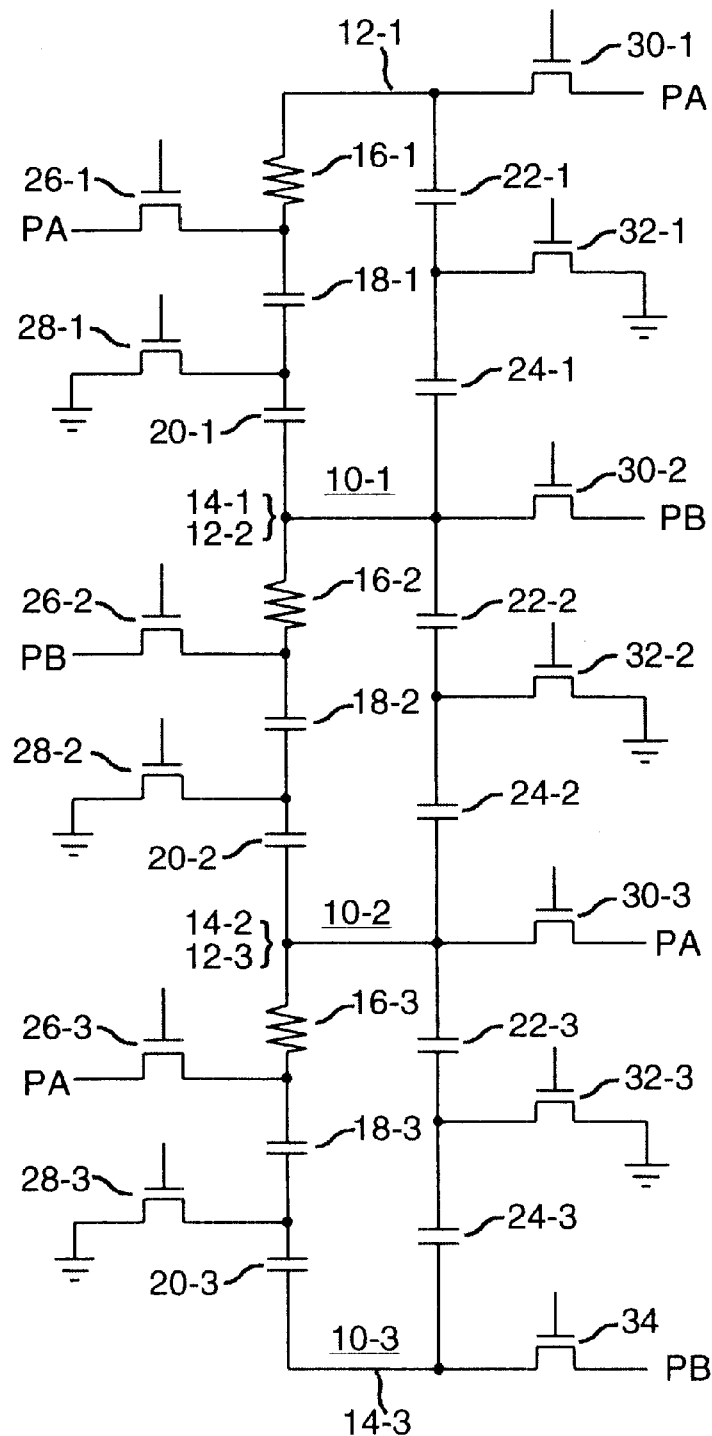
FIG. 2 is a schematic diagram of an illustrative embodiment of a plurality of series-connected user-programmable resistor module according to the present invention.

This feature of the present invention may be seen by examining FIG. 2, to which attention is now drawn. In FIG. 2, the circuit elements corresponding to the same circuit elements of FIG. 1 are all designated by the same reference numerals used to identify the circuit elements of FIG. 1, followed by a suffix identifying which module (first, second, or third) to which the element belongs. This numbering will aid in the understanding of the connections for the programming transistors in odd and even modules.

Referring now to FIG. 2, a plurality of user-programmable resistor modules 10-1 through 10-3 are shown connected in series. Thus as seen in FIG. 2, input node 12-1 of first user-programmable resistor module 10-1 is the input of the combination. Further, ouput node 14-1 of first user-programmable resistor module 10-1 is common with input node 12-2 of second user-programmable resistor module 10-2. Similarly, ouput node 14-2 of second user-programmable resistor module 10-2 is common with input node 12-3 of second user-programmable resistor module 10-3. Finally, output node 14-3 of third user-programmable resistor module 10-3 is the output of the combination.

The plurality of series-connected user-programmable resistor modules according to the present invention may be programmed such that any combination (including none) of the resistive elements 16-1 through 16-3 may be connected in series between the input node 12-1 and output node 14-3 of the combination.

As described above and as seen in FIG. 3, the first programming transistors (26-1 and 26-3, respectively) of the odd-numbered user-programmable resistor modules (10-1 and 10-3) are connected between the common connection of their resistive elements (16-1 and 16-3, respectively) and their first antifuses (18-1 and 18-3, respectively) and the first programming voltage node PA. The first programming transistor 26-2 of the even-numbered user-programmable resistor module 10-2 is connected between the common connection of its resistive element 16-2 and its first antifuse 18-2 and the second programming voltage node PB. If there was a fourth module 10-4, its programming transistors would also be so conmnected.

The third programming transistors (30-1 and 30-3, respectively) of the odd-numbered user-programmable resistor modules 10-1 and 10-3 are connected between their input circuit nodes (12-1 and 12-3, respectively) and the first programming voltage node PA. The third programming transistor 30-2 of the even-numbered user-programmable resistor module 10-2 is connected between its input circuit node 12-2 and the second programming voltage node PB.

A termination programming transistor 34 is connected between the output circuit node 14-3 of the last user-programmable resistor module 10-3 in the plurality of series-connected user-programmable resistor modules and a programming voltage node. Because the last user-programmable resistor module is an odd numbered one, the second programming voltage node PB is used. If the last user-programmable resistor module had been an even numbered one, the first programming voltage node PA would have been used.

The programming of the plurality of series-connected user-programmable resistor modules of the present invention is carried out in the manner described for programming a single one of the modules. Persons of ordinary skill in the art will observe that in this embodiment of the present invention, as in the embodiment depicted in FIG. 1, the use of pairs of antifuses prevents unwanted programming of antifuses.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A cascadeable user-programmable resistor module comprising:

an input circuit node;

an output circuit node;

a resistive element connected in series with first and second antifuses between said input circuit node and said output circuit node;

third and fourth antifuses connected in series between said input circuit node and said output circuit node;

a first programming transistor connected between a common connection of the resistive element and the first antifuse and a first programming voltage node;

a second programming transistor connected between a common connection of the first and second antifuses and a fixed voltage node;

a third programming transistor connected between said input circuit node and said first programming voltage node;

a fourth programming transistor connected between a common connection of the third and fourth antifuses and a fixed voltage node.

2. The cascadeable user-programmable resistor module of claim 1 further including a terminating programming transistor connected between said output voltage node and a second programming voltage node.

3. A user-programmable resistor comprising:

a first programming voltage node;

a second programming voltage node;

a plurality of odd and even user-programmable resistor modules, each module including a resistive element connected in series with first and second antifuses between an input circuit node and an output second circuit node and third and fourth antifuses connected in series between said input node and said output circuit node, each module further including a first programming transistor connected between a common connection of said resistive element and said first antifuse and a first programming voltage terminal, a second programming transistor connected between a common connection of said first and second antifuses and a fixed voltage node, a third programming transistor connected between said input circuit node and said first programming voltage terminal, a fourth programming transistor connected between a common connection of said third and fourth antifuses and said fixed voltage node;

said plurality of odd and even user-programmable resistor modules connected in series such that the input node of each successive user-programmable resistor module is connected to the output node of a preceding user-programmable resistor module;

the first programming voltage terminal of each odd user-programmable resistor module connected to said first programming circuit node and the first programming voltage terminal of each even user-programmable resistor module connected to said second programming circuit node; and a termination programming transistor connected between the output circuit node of a last one of said user-programmable resistor modules in the plurality of series-connected user-programmable resistor modules and a terminating programming voltage node, said terminating programming voltage node being said second programming voltage node if said last one of said user-programmable resistor modules is odd, and said terminating programming voltage node being said first programming voltage node if said last one of said user-programmable resistor modules is even.

4. The user-programmable resistor of claim 3 wherein resistance values of said resistance elements in said plurality of odd and even user-programmable are chosen to implement a R2R ladder network.

5. A user-programmable resistor comprising:

an input node;

an output node;

a discrete resistance element;

an antifuse network coupled between said input node, said resistance element, and said output node, said antifuse network including a plurality of antifuses configured to selectively couple said input node to said output node either directly or through said resistance element by programming selected ones of said antifuses, wherein two antifuses of said plurality are coupled in series with said resistance element.

* * * * *